United States Patent [19]

Furihata et al.

[11] Patent Number: 4,670,859

[45] Date of Patent: Jun. 2, 1987

[54] LOGIC CIRCUIT

[75] Inventors: Makoto Furihata, Tamamura; Setsuo Ogura, Takasaki; Shizuo Kondo, Takasaki; Eiji Minamimura, Takasaki, all of Japan

[73] Assignee: Hitachi, Ltd., Tokyo, Japan

[21] Appl. No.: 704,412

[22] Filed: Feb. 22, 1985

[30] Foreign Application Priority Data

Feb. 24, 1984 [JP] Japan .................................. 59-32358

[51] Int. Cl.$^4$ ............................................. G11C 17/00
[52] U.S. Cl. ..................................... 365/104; 365/227
[58] Field of Search ................. 365/94, 103, 104, 174, 365/230, 231, 226, 227

[56] References Cited

U.S. PATENT DOCUMENTS 4,374,431 2/1983 Ono et al. ............................. 365/174
4,532,612 7/1985 Tanaka et al. ....................... 365/227

FOREIGN PATENT DOCUMENTS 56-28050 6/1981 Japan .

Primary Examiner—Joseph A. Popek
Attorney, Agent, or Firm—Antonelli, Terry & Wands

[57] ABSTRACT

A logic circuit of a large scale which consumes small amounts of electric power is comprised of a plurality of ROM portions each formed of IIL circuits. Input signal lines are commonly used to transmit input signals to the ROM portions. The plurality of ROM portions are selectively operated by ROM select signals, and outputs corresponding to the input signals are obtained from a selected ROM portion. To select a particular ROM portion out of the plurality of ROM portions, the emitters of inverse npn transistors of IIL circuits constituting the selected ROM portion are rendered to assume ground potential. In the meantime, the emitters of the inverse npn transistors of IIL circuits in the non-selected ROM portions are held in a floating condition. This makes it possible to obtain a logic circuit which consumes small amounts of electric power with a very simple construction since the non-selected ROM portions consume no power.

9 Claims, 9 Drawing Figures

LOGIC CIRCUIT

BACKGROUND OF THE INVENTION

The present invention relates to a logic circuit, and particularly to a logic circuit employing IIL (integrated injection logic) circuits.

A logic circuit employing IIL circuits has such advantages that it can be highly integrated without requiring isolation regions to individually isolate the elements, and that it can be constructed in the form of a semiconductor integrated circuit device containing analog circuits and digital circuits, without deteriorating the characteristics in the analog circuit portion.

To operate the IIL circuits, however, a constant current called an injection current must be supplied at all times. It was clarified through the study by the inventors of the present invention that if it is attempted to form a large ROM (readonly memory) using IIL circuits, the consumption of electric power, i.e., the sum of constant currents flowing into the individual IIL circuits becomes so great that it is difficult to dissipate the heat that is generated.

It was also found that as the number of IIL circuits increases, the fan out becomes very great to drive logic inputs for the IIL circuits, making it necessary to employ a drive buffer having an extremely large output capacity.

For instance, when a ROM that operates on a logic input of 8-bit strings is to be constituted with IIL circuits each capable of forming 16 collector electrodes (i.e., using IIL circuits each having 16 collectors), it is necessary to supply electric current in an amount to drive 256 IIL circuits simultaneously and to provide a drive capacity to meet the current capacity. In practice, therefore, it is very difficult to realize such a ROM.

The present invention was accomplished by giving attention to the above difficulty, and its object is to provide a logic circuit technique which makes it possible to obtain logic circuits constituted by IIL circuits or logic circuits consisting chiefly of such memory circuits as ROM's of large scale, without so increasing the consumption of electric power and without strikingly increasing the capacity of the drive buffer.

SUMMARY OF THE INVENTION

The invention will be described below briefly. Namely, a plurality of ROM's of a large capacity constituted by IIL circuits are prepared, and one of them is selected by the high-order bits of an input signal. Further, the input and output terminals of the ROM's are commonly formed. A ROM can be selected very simply by rendering the emitters of inverse transistors constituting the IIL circuits of the selected ROM to assume ground potential while the emitters of inverse transistors constituting the IIL circuits of non-selected ROM's are held in a floating condition, relying upon switching means.

The above-mentioned structure makes it possible to accomplish the object of the present invention, i.e., to obtain logic circuits constituted by IIL circuits or digital memory circuits such as large ROM's, without so increasing the consumption of electric power and without extremely increasing the capacity of drive buffer.

DESCRIPTION OF THE PREFERRED EMBODIMENTS

Embodiment 1

Figure 1:
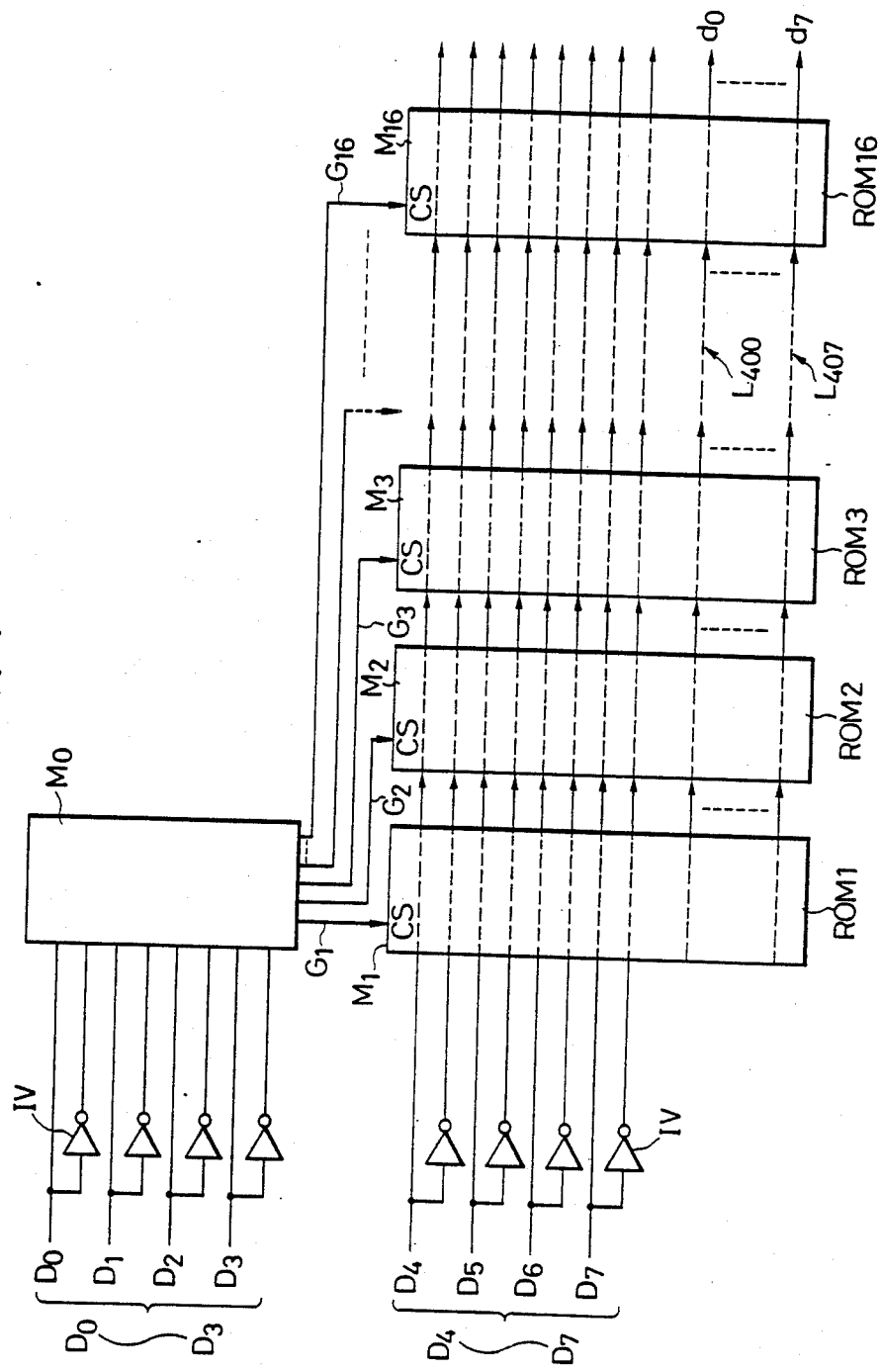
FIG. 1 is a block diagram illustrating a fundamental structure of a logic circuit according to an embodiment of the present invention.

A first embodiment of the invention will be described below in conjunction with the drawings.

In the drawings, the same or corresponding portions are denoted by the same symbols.

FIG. 1 shows the fundamental structure of a digital memory according to an embodiment of the present invention.

The memory of FIG. 1 consists of a ROM that is constituted by IIL circuits and that operates on logic inputs D0 to D7 comprised of eight-bit strings. The ROM constituted by IIL circuits is divided into 16 ROM portions M1 to M16 which are formed in island regions formed on a semiconductor substrate. The individual island regions are floated from the common ground potential GND. As will be mentioned later, any one of a plurality of ROM portions is selected by the output of a selecting ROM portion M0.

Logic inputs D0 to D7 of eight-bit strings are divided into two groups, i.e., divided into high-order bit strings D0 to D3 and low-order bit strings D4 to D7. Responsive to the low-order bits D4 to D7, complementary signals are generated which are divided into positive logic and negative logic, and are commonly input to the plurality of ROM portions M1 to M16. Complementary signals generated responsive to the high-order bit strings D0 to D3 are input to a selecting ROM M0 that generates a control signals to select any one of ROM 1 to ROM 16.

The selecting ROM portion M0 performs the decoding operation based upon the logic condition of the high-order four-bit strings D0 to D3, and outputs G1 to G16 thereof are input to select terminals CS. The outputs G1 to G16 are select signals produced by the ROM portion, and any one of the plurality of ROM portions M1 to M16 is selected by the select signals. That is, a ROM portion selected by the select signals G1 to G16 is liberated from the floating conditions as the potential of the island region thereof is connected to common ground potential GND, whereby this selected ROM portion only is substantially served with an electric current from a power source and is activated. As for the 16 ROM portions M1 to M16, therefore, an electric current Io flows at all times, which is equal to the electric current that flows into only one ROM portion.

The above-mentioned logic circuit will be described below more concretely with reference to FIGS. 2 to 6 which illustrate a semiconductor integrated circuit device consisting of a single semiconductor chip.

Figure 2:
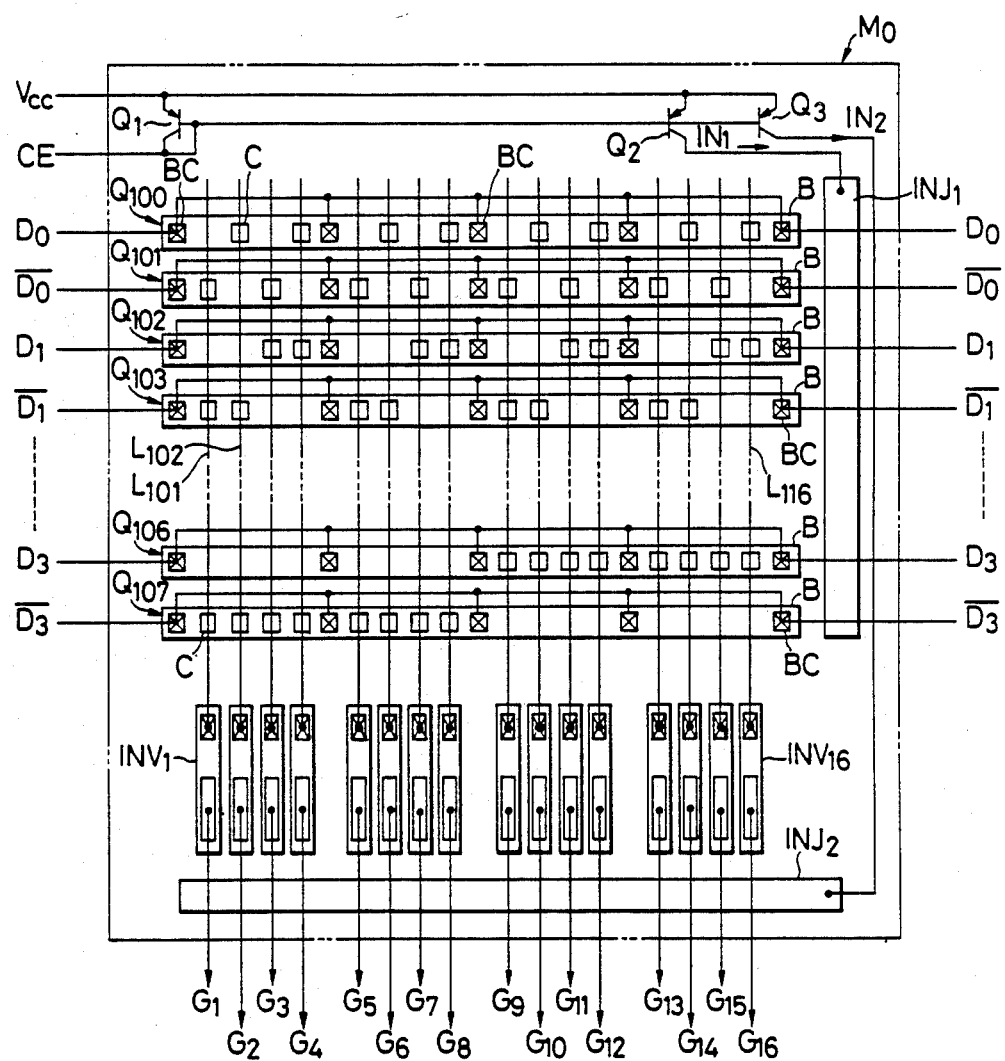
FIG. 2 is a plan view showing the layout in a semiconductor integrated circuit device of a selecting ROM portion which produces select signals according to the embodiment of the present invention.

FIG. 2 is a plan view showing the layout of the selecting ROM portion M0 that produces select signals in the semiconductor integrated circuit device.

Figure 3:
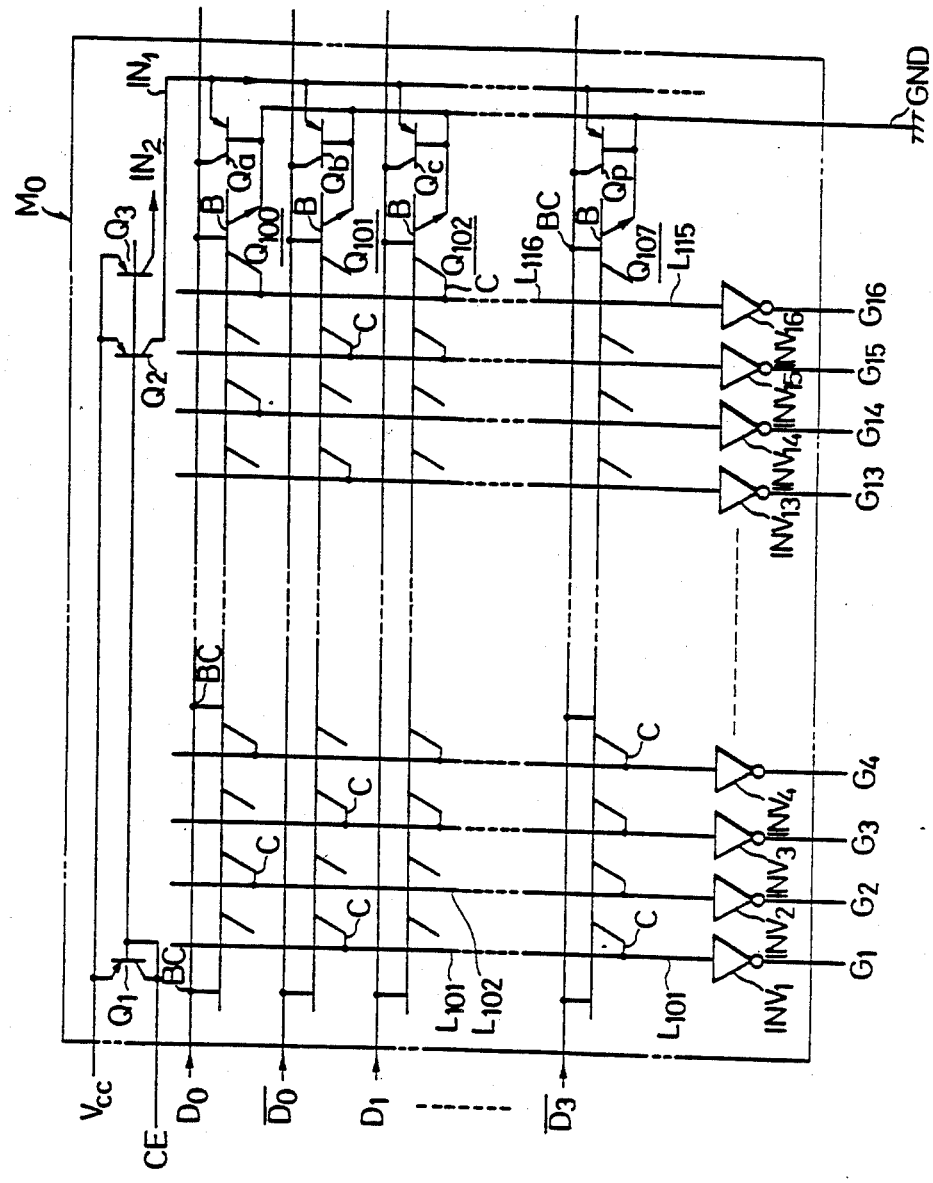
FIG. 3 is a diagram showing the circuit of selecting ROM portion of FIG. 2.

FIG. 3 is a diagram showing the circuit of selecting ROM portion of FIG. 2.

In FIGS. 2 and 3, the selecting ROM portion M0 is constituted by an IIL circuit. That is, the ROM portion M0 consists of transistors Q100 to Q107 with 16 collectors to constitute the IIL circuits, 16 inverters INV1 to INV16 consisting of IIL circuits, and bipolar transistors Q1, Q2 and Q3 that control injection currents IN 1, IN 2.

The multi-collector transistors Q100 to Q107 have laterally elongated base regions B so that 16 collectors can be taken out therefrom. The base regions B are formed in parallel with each other. A common injector INJ 1 is formed at a portion close to the ends of the base regions B. An injection current IN 1 is supplied to the injector INJ 1 via a transistor Q2. Each base region B is provided with base electrode take-out portions BC at a plurality of places maintaining a suitable distance to eliminate variance in characteristics irrespective of the positions of collectors C.

Further, 16 wirings L101 to L116 are arranged maintaining an equal distance traversing the base regions B of the multi-collector transistors Q100 to Q107 at right angles therewith. With regard to intersecting portions of the wiring L101 to L116 and the collectors of the transistors Q100 to Q107, the collector contacts C are formed at the arbitrarily selected portions only and are connected to the wiring. Therefore, a wired NOR logic is formed for each line of the wiring L101 to L116. The wired logic outputs of the wiring L101 to L116 are input to inverters INV1 to INV16 which consist of IIL circuits, respectively. The select signals G1 to G16 are produced from these inverters INV to INV16. The levels of signals G1 to G16 are those of the IIL circuits; i.e., the high level is about 0.7 volt, and the low level is ground potential. When the signals G1 to G16 assume the low level, the ROM's M1 to M16 corresponding to these signals are rendered operative. The inverters INV1 to INV16 operate on an injection current IN2 supplied via a transistor Q3.

The transistors Q1, Q2 and Q3 that control the injection currents IN1, IN2 are controlled by a chip select signal CE supplied from an external unit. As the transistor Q1 is rendered conductive by the signal CE, the transistors Q2 and Q3 are also rendered conductive, whereby the injection currents IN1, IN2 are supplied to the injectors INJ1, INJ2, respectively.

Figure 4:
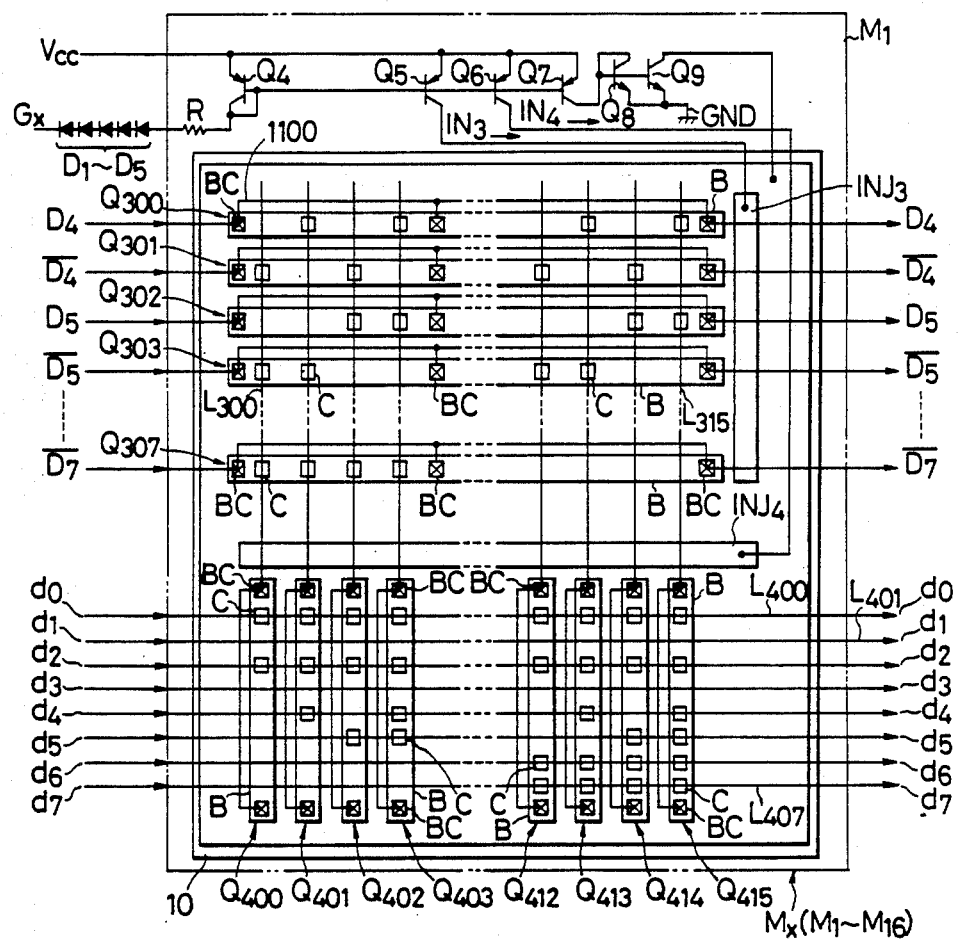
FIG. 4 is a plan view showing the layout of a semiconductor integrated circuit device of a ROM portion among a plurality of ROM portions according to the embodiment of the present invention.

FIG. 4 is a plan view showing the layout of a semiconductor integrated circuit device in any one (Mx) of the ROM portions M1 to M16.

Figure 5:
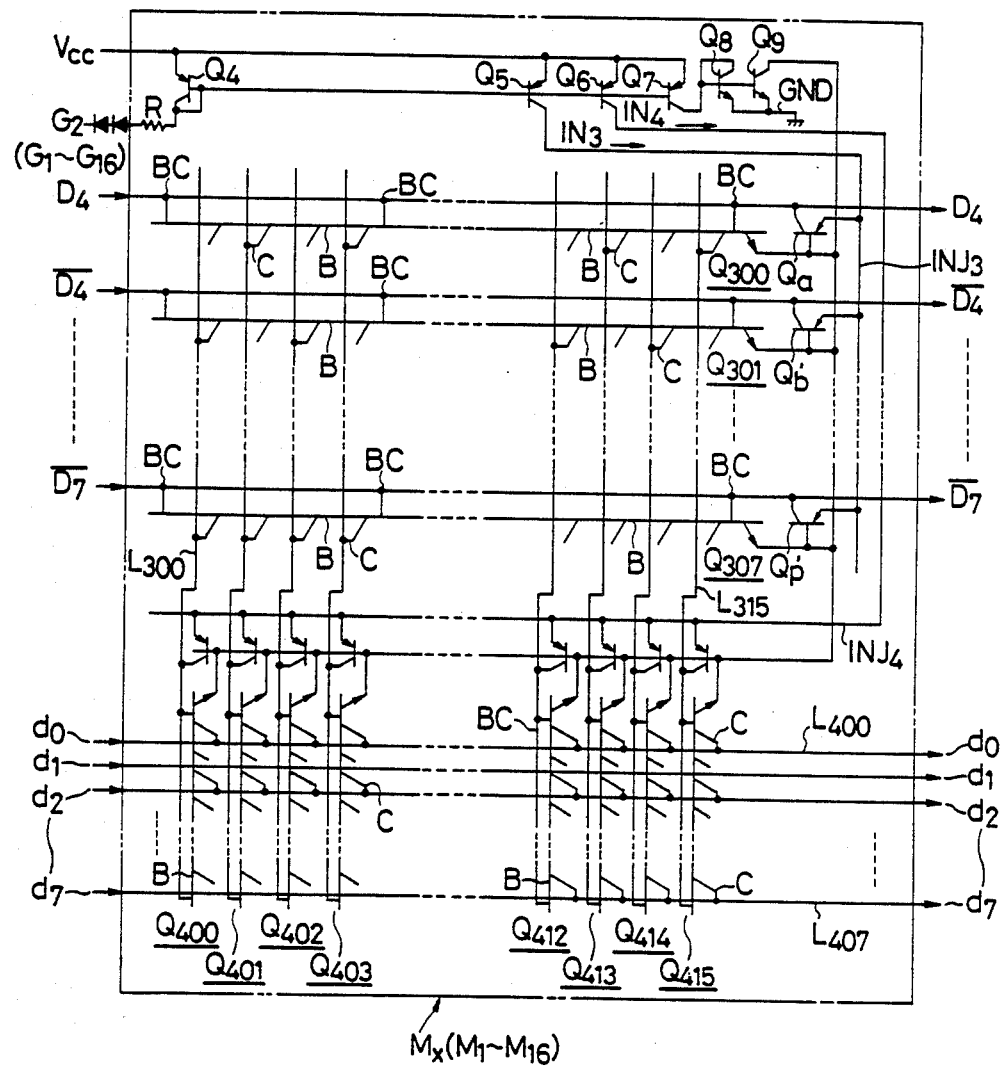
FIG. 5 is a diagram showing the circuit of ROM portion of FIG. 4.
Figure 6:
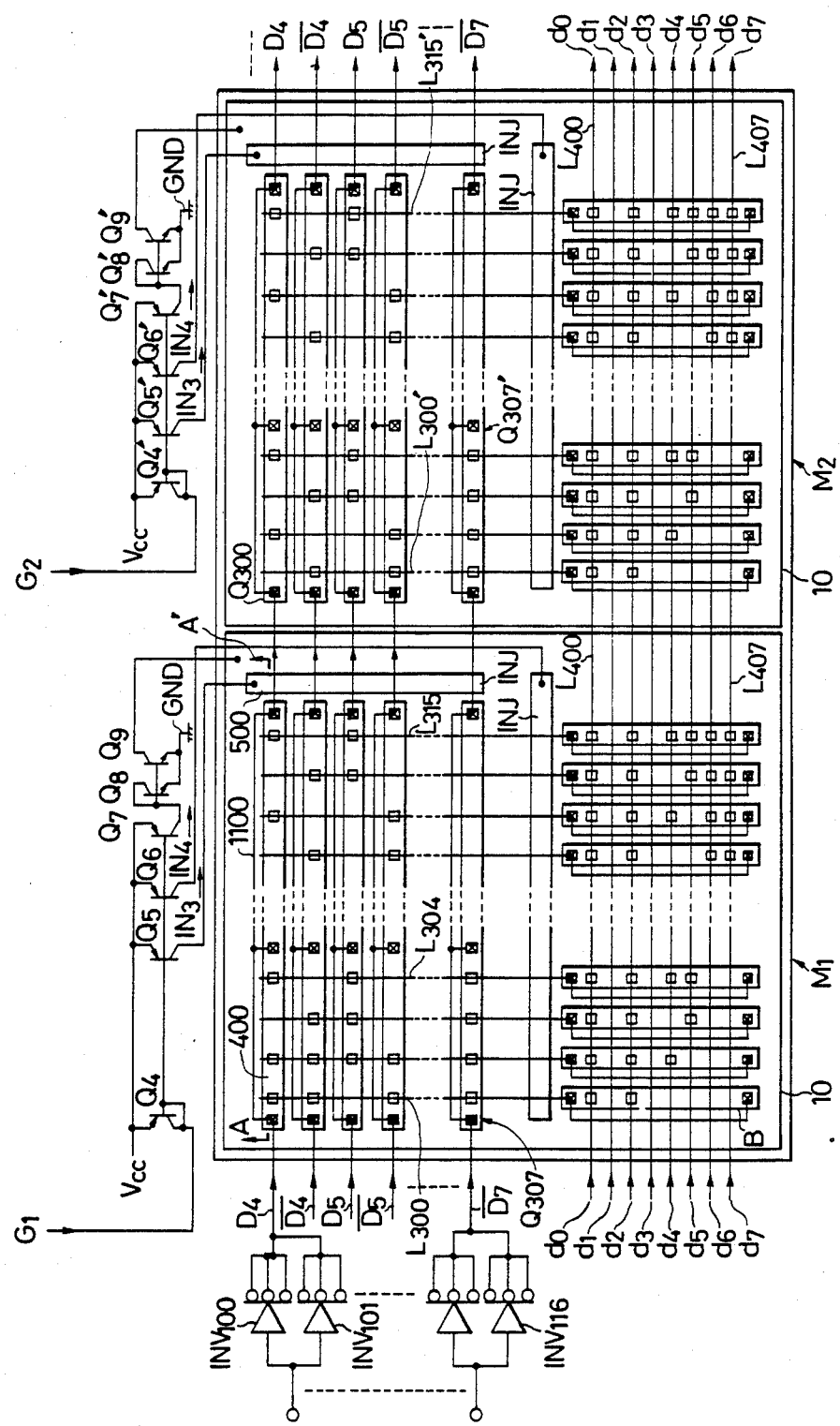
FIG. 6 is a plan view showing the layout of a ROM portion M1 and a ROM portion M2.

FIG. 5 is a diagram of the circuit of ROM portion of FIG. 4, and FIG. 6 is a diagram showing the layout of the ROM's M1 and M2.

The ROM portion shown in FIGS. 4 and 5 is one (Mx) of the 16 ROM portions M1 to M16. In FIGS. 4 and 5, the ROM portion Mx is constituted by using IIL circuits. That is, the ROM portion Mx consists of eight multi-collector transistors Q300 to Q307 arranged in the vertical direction, 16 multicollector transistors Q400 to Q415 arranged in the lateral direction, bipolar transistors Q4, Q5, Q6 for controlling the injection currents IN3, IN4, and bipolar transistors Q7, Q8, Q9 for controlling the connection relative to common ground potential GND.

Here, the region where the two IIL circuit groups (Q300 to Q307 and Q400 to Q415) are formed is electrically isolated from other portions by an isolation region 10 that consists, for example, of an isolation diffusion layer. The region surrounded by the isolation region 10 is caused to assume ground potential or the floating condition, by controlling the conductivity of the bipolar transistor Q9.

The multi-collector transistors Q300 to Q307 of the first group have laterally elongated base regions B so that the collector contacts C can be taken out therefrom. The base regions B are formed in parallel with each other. A common injector INJ3 is formed at a portion close to the ends of the base regions B. An injection current IN3 is supplied to the injector INJ3 via a transistor Q5. Each base region B is provided with base electrode take-out portions BC at a plurality of places maintaining a suitable distance to eliminate variance in characteristics irrespective of the positions of collector contacts C.

Further, 16 wirings L300 to L315 are arranged maintaining an equal distance traversing the base regions B of the multi-collector transistors Q300 to Q307. With regard to intersecting portions of the wiring L300 to L315 and the collectors of the transistors Q300 to Q307, the collector contacts C are formed at the arbitrarily selected portions only and are connected to the wiring. Therefore, a wired logic is formed for each of the wirings L300 to L315. The wired logic outputs of the wirings L300 to L315 are input to the bases B of multi-collector transistors Q400 to Q415 of the second group.

The multi-collector transistors Q400 to Q415 of the second group have vertically elongated base regions B so that collector contacts C can be taken out therefrom. The base regions B are formed in parallel with each other. A common injector INJ4 is formed at a portion close to the ends of the base regions B. An injection current IN4 is supplied to the injector INJ4 via a transistor Q6. Each base region B is provided with base electrode take-out portions BC at a plurality of places maintaining a suitable distance to eliminate variance in characteristics irrespective of the positions of collector contacts C.

Eight wiring lines L400 to L407 are arranged maintaining an equal distance traversing the base regions B of the multi-collector transistors Q400 to Q415 of the second group at right angles therewith. The wiring lines L400 to L407 are commonly wired among the ROM portions M1 to M16. With regard to intersecting portions of the wiring L400 to L407 and the base regions B, the collector contacts C are formed at the arbitrarily selected portions and are connected to the wiring. Therefore, a wired logic is formed for each of the wiring L400 to L407. The wired logic outputs of the wiring L400 to L407 are produced to an external unit as common logic outputs D0 to d7 through other ROM portions.

The transistors Q4, Q5, Q6 for controlling the injection currents IN3, IN4, and the transistors Q7, Q8, Q9 for controlling the connection to common ground potential GND of island regions, are controlled by a select signal Gx among the select signals G1 to G16 produced by the decoder portion M0. Current mirrors are constituted by the transistor Q4 and transistors Q5, Q6, Q7, and by the transistors Q8 and Q9. Via level-shifting diodes D1 to D5, the signal Gx is input to the collector of the diode-connected transistor Q4 which constitutes the current mirror.

It is presumed that the diodes D1 to D5 have a forward voltage of 0.7 volt, and the power-source voltage Vcc has been set to 5 volts. When the signal Gx is at the high level (0.7 volt), therefore, there is produced no forward voltage $V_F$ for the diode-connected transistor Q4; i.e., the transistor Q4 is not turned on. On the other hand, when the signal Gx is selected, and the logic condition thereof assumes the "L" level (low logic level), the transistor Q4 is rendered conductive, whereby the transistors Q5 to Q9 are rendered conductive, and injection currents IN3, IN4 are supplied to the injectors INJ3, INJ4. Further, the region surrounded by the isolation region 10 is connected to common ground potential GND, and the ROM portion Mx is activated.

A ROM portion selected by the high-order bits D0 to D3 produces logic outputs d0 to d7 responsive to low-order bits D4 to D7 through common output lines L400 to L407. Therefore, the logic outputs d0 to d7 produced from the common output lines L400 to L407 serve as logic output for the 8-bit logic input which consists of the high-order four bits and the low-order four bits. Namely, it is possible to constitute a ROM which, as a whole, operates on logic inputs D0 to D7 of eight-bit strings, while supplying the operation current Io to only one of the ROM portions.

As described above, any one of the 16 ROM portions M1 to M16 is selected by the high-order bit strings D0 to D3 and is activated. The thus activated ROM portion operates based upon the low-order bit strings D4 to D7, and produces logic outputs d0 to d7 according to logic conditions which have been programmed beforehand. In other non-selected ROM portions, on the other hand, no base current flows into the bases of transistors Q300 to Q307 constituting the IIL circuits, since the emitters thereof are floated from ground potential GND despite the fact that the base voltage is applied with the low-order bits. Namely, the non-selected ROM portions remain at rest under the condition where operation current and drive current are not consumed. Namely, the ROM portion selected by the select signals G1 to G16 is released from the floating condition, since the potential of the island region thereof is connected to common ground potential GND. Therefore, the selected ROM portion only is substantially served with an electric current from the power source and is activated. As for the 16 ROM portions M1 to M16, therefore, only the electric current Io flows at all times, which is equal to the electric current consumed by one ROM portion. Thus, the consumption of electric power can be greatly reduced.

Further, although the low-order bit strings D4 to D7 have been commonly connected to the logic inputs of the ROM portions, only one ROM portion is activated among them as described above, and other ROM portions are floated from common ground potential GND. When viewed from the input side, therefore, the drive capacity (fan out) is required which is large enough to drive only one ROM portion. According to this embodiment, therefore, the same effects can be obtained as those of when the whole logic circuit is driven but requiring a drive capacity which is about 1/16 that of when the whole logic circuit is to be driven. In effect, the drive capacity can be greatly reduced, and the burden for drive can be greatly reduced. M0reover, since base lines D4 to D7 of low-order bits can be commonly used as shown in FIG. 6, the base-driving IIL circuits (INV100 to INV116 of FIG. 6) can be commonly used to further reduce the consumption of electric power. There is no need to provide a base-driving IC for each of the ROM portions, and the chip area can be greatly reduced. Further, since the base lines are commonly used, the wiring layout can be greatly simplified, offering increased freedom of layout.

In the above-mentioned embodiment, furthermore, the logic inputs are successively introduced into the plurality of ROM portions M1 to M16 along the direction in which the base regions B of IIL circuits Q300 to Q307 constituting the ROM portions M1 to M16 run. Therefore, the wiring can be very simply and neatly arranged among the ROM portions M1 to M16. Further, the memory can establish the interface relative to IIL circuits as a matter of course. At present, IIL circuits having various advantages are frequently used as digital elements. Therefore, the IIL compatibility presents a great merit even from the standpoint of expanding the utilizable range for the users.

Figure 8:
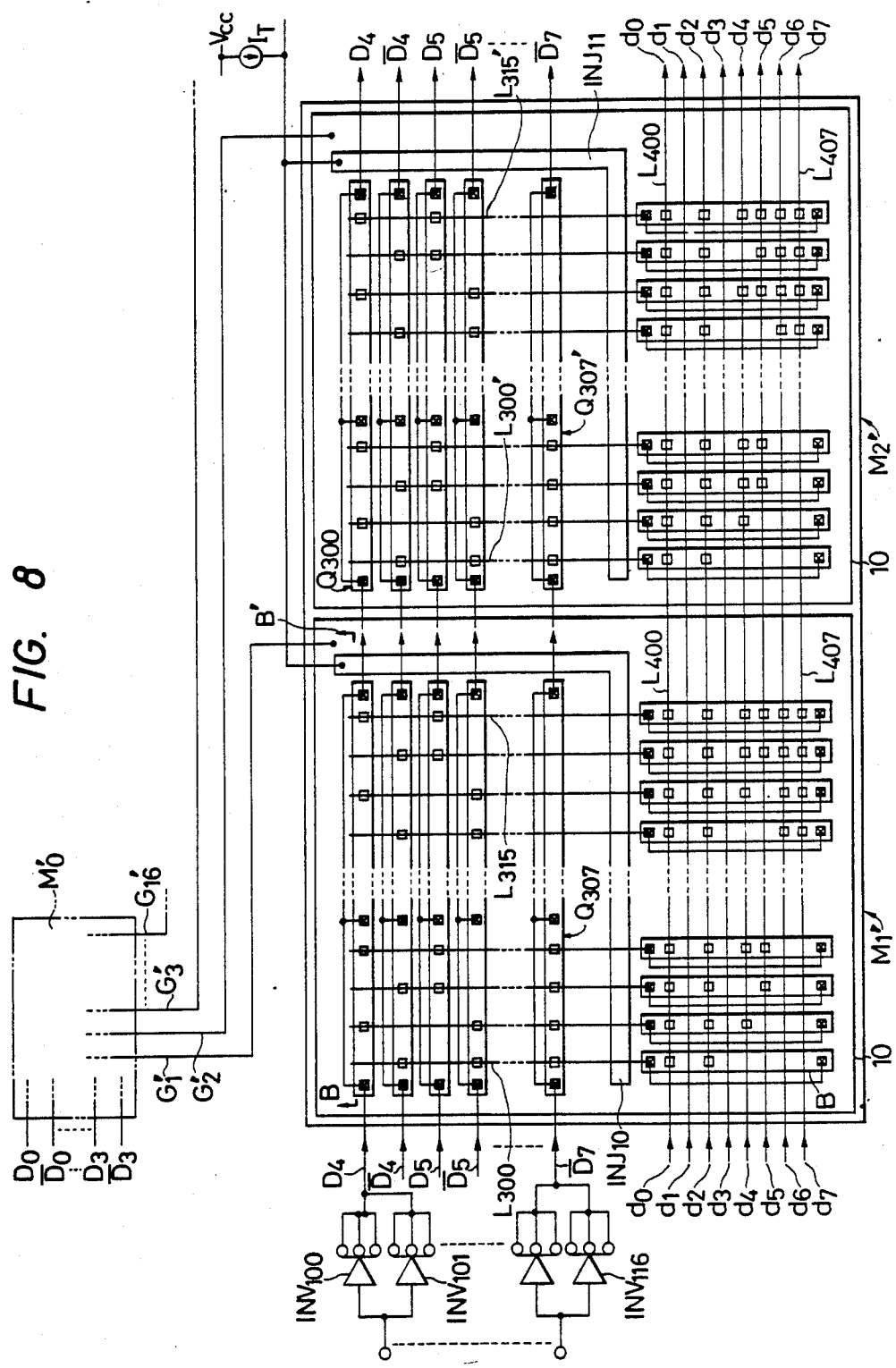
FIG. 8 is a plan view showing the layout of the whole memory according to the second embodiment of the present invention.
Figure 9:
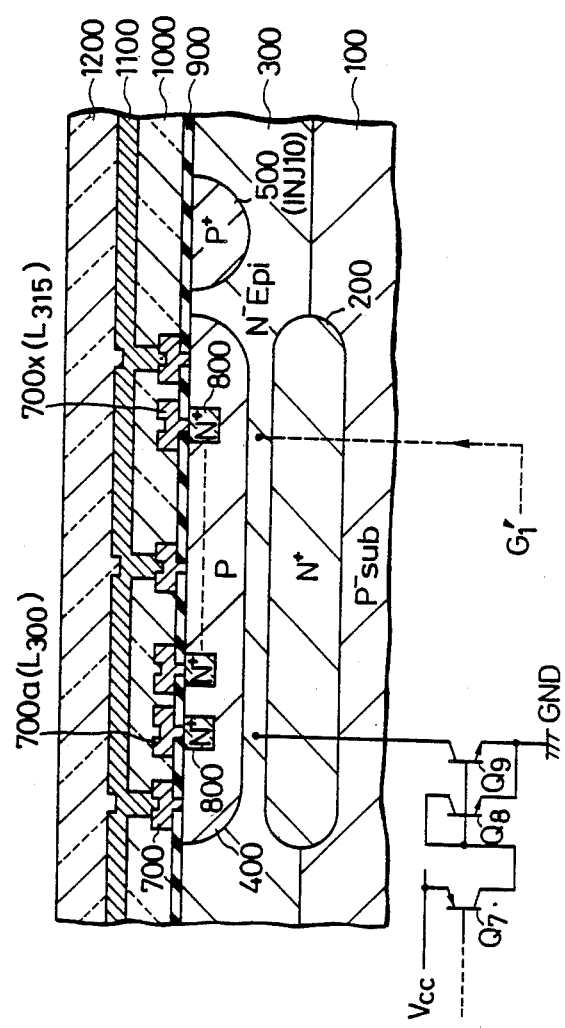
FIG. 9 is a diagram showing in combination a section view along the line A—A' of FIG. 6 and a section view along the line B—B' of FIG. 8.

FIG. 9 is a section view of the chip cut along the line A—A' in FIG. 6 (cut along the line B—B' in FIG. 8).

Structure of the device is simply described below. An N+-type buried layer 200 is provided in a portion of a P--type silicon substrate 100, and an N--type epitaxial layer 300 is formed on the P--type silicon substrate 100 and on the N+-type buried layer 200. In the epitaxial layer 300 are formed a P-type diffusion layer 400 that serves as the base of an inverse transistor constituting the IIL circuit, and a P+-type diffusion layer 500 that serves as an injector. In the P-type diffusion layer 400 are further formed a plurality of N+-type diffusion layers 800 that serve as collectors. A thermally oxidizing film 900 is formed on the main surface of the N--type epitaxial layer 300. An aluminum wiring 700 of the first layer is contacted to the epitaxial layer 300 through openings formed in the thermally oxidizing film 900.

The aluminum wirings 700a to 700x run in a direction perpendicular to the surface of the paper to constitute aluminum wiring L300 to L315 of FIG. 6.

There is further formed an intermediate insulating film 1000 consisting of an SiO$_2$ film formed by the chemical vapor deposition, and aluminum wiring 1100 of the second layer is formed thereon. Portions of the second aluminum layer 1100 are connected to the first aluminum layer 700 through the holes formed in the intermediate insulating film 1000. On the second aluminum layer 1100 is formed a final passivation film 1200 composed, for example, of a polyimide-type resin.

As described above, the N--type epitaxial layer 300 can be caused to assume ground potential or the floating condition by controlling the conductivity of the switching transistor Q9. This makes it possible to control the select or non-select of ROM portions.

According to the present invention as described above, the capacity of a ROM employing IIL circuits can be increased without so increasing the chip area, limiting the consumption of electric power.

This can be realized very simply by isolating the individual ROM portions by isolation layers, and by providing a switching circuit which causes the emitters of inverse transistors in IIL circuits to assume the floating condition or ground potential. Therefore, the consumption of electric power does not increase in this portion, and the chip area does not increase, either. Further, in producing integrated circuits that contain analog circuits and digital circuits the isolation layers for isolating the individual ROM portions can be formed simultaneously with the formation of an isolation layer that isolates analog elements. Therefore, there is no increase in the process for producing integrated circuits.

Based upon the above-mentioned means that can be easily put into practice, simple calculation will show that the consumption of electric power can be reduced to, for example, one-eighth. Further, the base lines that are commonly arranged help greatly to reduce the chip area and increase freedom for layout. As described above, the principal features of the present invention are derived from the fact that it is accomplished by taking into consideration various characteristics that should be provided for integrated circuits.

Embodiment 2

A second embodiment of the present invention will be described below in conjunction with FIGS. 7 and 8. According to this embodiment, structure of the logic circuit of Embodiment 1 is simplified, and the number of elements constituting the logic circuit is reduced.

Figure 7:
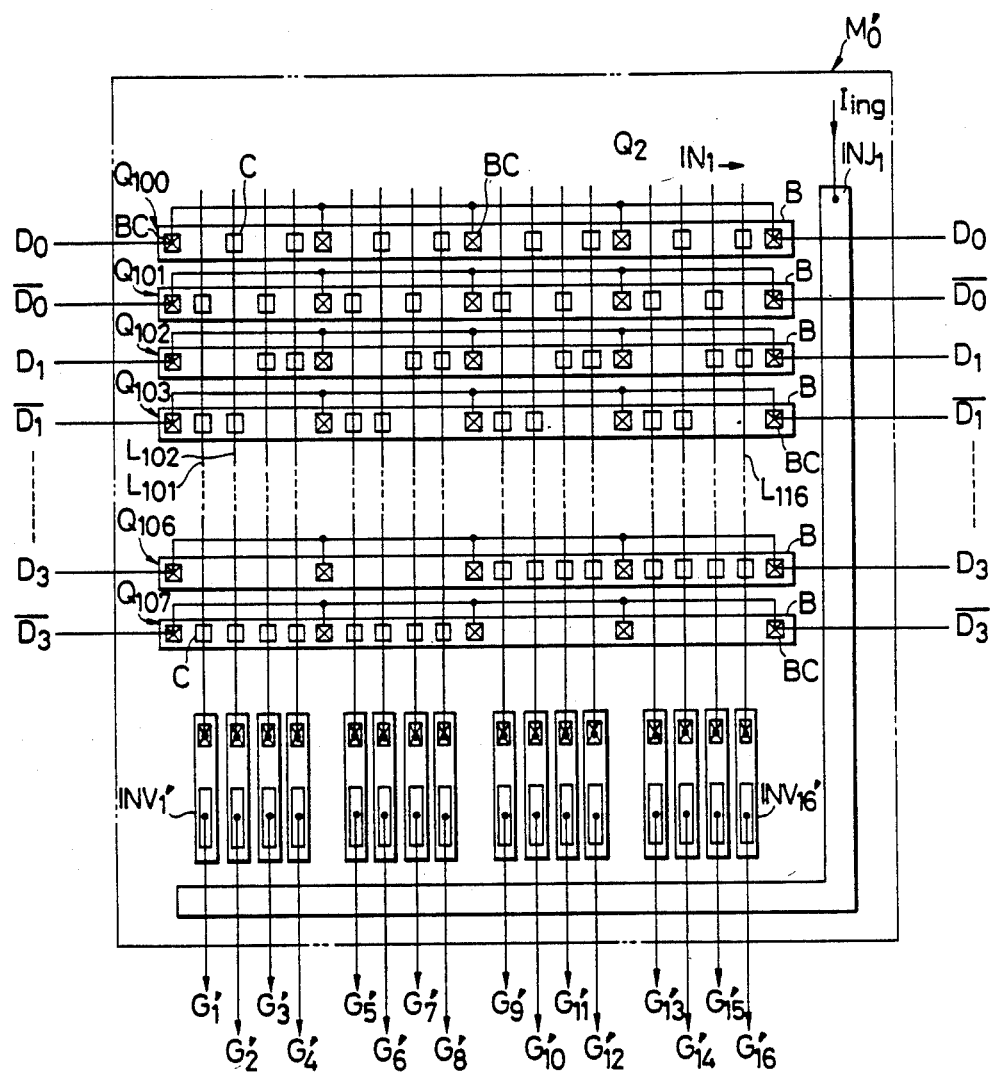
FIG. 7 is a plan view showing the layout of a selecting ROM portion M0' in a memory according to a second embodiment of the present invention.

The feature resides in that the select or nonselect of a plurality of ROM's shown in FIG. 8 is directly controlled by control signals G1' to G16' produced by a mat-selecting ROM M0' that is shown in FIG. 7.

The selecting ROM M0' shown in FIG. 7 is constructed in the same manner as that of FIG. 2 and is not explained here. The control signals G1' G16' generated by the selecting ROM M0' have a low level of zero volts and a high level, which is the IIL level, of 0.7 volt. As shown by a dotted line in FIG. 9, therefore, if the control signal line is directly connected to the epitaxial layer of each of the ROM portions, it is possible to control the select or non-select of the ROM portions.

As shown in FIG. 8, furthermore, the injector is formed in a single form (INJ10, INJ11, ---) in the ROM portions M1', M2', ---, and each of the injectors is connected to a single constant-current source $I_T$. The injection current can be automatically controlled if the potential of the epitaxial layer of a plurality of ROM portions is controlled by the select signals G1' to G16'.

FIG. 9 is a section view along the line B—B' of FIG. 8.

According to the present invention, the following effects are obtained as will be obvious from the aforementioned two embodiments.

(1) The ROM is divided into a plurality of ROM portions which are floated from common ground potential. Bit strings of logic inputs are divided into two groups, the bit strings of one group being commonly input to the plurality of ROM portions, and the bit strings of the other group being used to produce select signals. A ROM portion is selected by the select signals and is liberated from the condition where it is floated from common ground potential. Only the selected ROM portion is activated. Therefore, the logic circuit based upon the IIL circuits and, particularly the logic circuit consisting chiefly of ROM can be realized on a large scale, without so increasing the consumption of electric power, and without requiring a drive buffer of an extremely large capacity.

(2) The logic inputs are introduced successively to the plurality of ROM portions along a direction in which the base regions of IIL circuits constituting the ROM portions run. Therefore, the wiring can be very simply and neatly arranged among the ROM portions, and a large ROM can be formed with simple construction.

Owing to the above-mentioned features (1) and (2), furthermore, there is obtained such a synergistic effect that a digital circuit having a data processing function of a high degree is formed together with an analog circuit without hindering the characteristics of the analog circuit.

In the foregoing were concretely described embodiments of the invention accomplished by the inventors of the present invention. The invention, however, should in no way be limited to the above-mentioned embodiments only but can be modified in a variety of other ways without departing from the gist and scope of the invention. In the above-mentioned embodiments, furthermore, the ROM portions were all surrounded by the isolation layer 10. The invention, however, should not be limited thereto only. That is, the region which must be completely isolated is the one where the transistors Q300 to Q307 are formed as shown in FIG. 4. The transistors Q400 to Q415, on the other hand, need not necessarily be formed in an island region surrounded by the isolation region.

In the foregoing was described the case where the invention accomplished by the inventors was adapted to logic circuit technique for producing single-chip-type semiconductor integrated circuit devices in such a field of utilization that served as the background of the invention. The invention, however, should in no way be limited thereto only. For instance, the invention can be adapted to a logic circuit technique constituted by using a plurality of semiconductor integrated circuit devices formed for each of the ROM portions. The invention can at least be adapted to the technique for forming large logic circuits.

We claim:

1. A logic circuit comprising:
   a first block including a plurality of signal lines and first and second multi-collector transistors, collectors of said first and said second multi-collector transistors being selectively connected with said plurality of signal lines of said first block, and emitters of said first and second multi-collector transistors being commonly connected;
   a second block including a plurality of signal lines and third and fourth multi-collector transistors, collectors of said third and said fourth multi-collector transistors being selectively connected with said plurality of signal lines of said second block, and emitters of said third and said fourth multi-collector transistors being commonly connected;
   first switching means connected between said emitters of said first and second multi-collector transistors and an operating potential, conduction and non-conduction of said first switching means being controlled by a first input signal;
   second switching means connected between said emitters of said third and said fourth multi-collector transistors and said operating potential, conduction and non-conduction of said second switching means being controlled by a second input signal;

means for supplying a third input signal to bases of said first and said third multi-collector transitors; and means for supplying a fourth input signal to bases of said second and said fourth multi-collector transistors, wherein selection of said first, second, third, and fourth multi-collector transistors to provide output signals on said signal lines of said first and second blocks is controlled by said first, second, third and fourth input signals.

2. A logic circuit according to claim 1, further comprising a control circuit which generates said first and said second input signals so as to make either one of said first and said second switching means be conductive in response to other input signals.

3. A logic circuit according to claim 1, wherein said first, said second, said third and said fourth multi-collector transistors are inverse transistors of integrated injection logic circuits.

4. A logic circuit according to claim 3, wherein said emitters of said first and second multi-collector transistors are formed of a first semiconductor region, wherein said emitters of said third and said fourth multi-collector transistors are formed of a second semiconductor region, and wherein said first semiconductor region and said second semiconductor region are electrically isolated from each other within a common substrate.

5. A logic circuit according to claim 4, wherein said first switching means operates in accordance with said first input signal to control said first semiconductor region to assume either operating potential or a floating condition, and wherein said second switching means operates in accordance with said second input signal to control said second semiconductor region to assume either said operating potential or a floating condition.

6. A logic circuit according to claim 1, wherein said first, second, third and fourth multi-collector transistors are arranged to form a matrix with the first and second multi-collector transistors forming a first row, said third and fourth multi-collector transistors forming a second row, said first and third multi-collector transistors forming a first column, and said second and fourth multi-collector transistors forming a second column, and further wherein said first and second switching means are arranged to control selection of said first and second rows, and wherein said means for supplying said third input signal and said fourth input signal are arranged to control selection of said first and second columns.

7. A logic circuit comprising:

a first block including a plurality of signal lines and first and second multi-collector transistors, collectors of said first and said second multi-collector transistors being selectively connected with said plurality of signal lines of said first block;

a second block including a plurality of signal lines and third and fourth multi-collector transistors, collectors of said third and said fourth multi-collector transistors being selectively connected with said plurality of signals lines of said second block;

first means controlled by a first input signal and connected with bases of said first and said second multi-collector transistors;

second means controlled by a second input signal and connected with bases of said third and said fourth multi-collector transistors;

third means controlled by a third input signal and connected with said bases of said first and said third multi-collector transistors; and fourth means controlled by a fourth input signal and connected with said bases of said second and said fourth multi-collector transistors, wherein, in accordance with a combination of said first, said second, said third and said fourth input signals, a base of a selected one of said first, said second, said third and said fourth multi-collector transistors is supplied with a current by a selected combination of said first, said second, said third and said fourth means.

8. A logic circuit according to claim 7, further comprising a control circuit which generates said first and said second input signals so as to make either one of said first and said second means be operative in response to other input signals.

9. A logic circuit according to claim 7, wherein said first, said second, said third and said fourth multi-collector transistor are inverse transistors of integrated injection logic circuits.

* * * * *